(12) United States Patent
Kawakita (10) Patent No.: US 8,093,130 B2
(45) Date of Patent: Jan. 10, 2012

(54) METHOD OF MANUFACTURING A SEMICONDUCTOR DEVICE HAVING RAISED SOURCE AND DRAIN OF DIFFERING HEIGHTS

(75) Inventor: Keizo Kawakita, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 853 days.

(21) Appl. No.: 12/022,363

(22) Filed: Jan. 30, 2008

(65) Prior Publication Data

US 2008/0179650 A1    Jul. 31, 2008

(30) Foreign Application Priority Data

Jan. 31, 2007   (JP) .................................. 2007-021777

(51) Int. Cl.
*H01L 21/336*     (2006.01)
(52) U.S. Cl. ................ 438/300; 438/286; 257/E21.431; 257/E21.62
(58) Field of Classification Search .................. 438/300, 438/286; 257/E21.43, E21.431, E21.62
See application file for complete search history.

(56) References Cited

U.S. PATENT DOCUMENTS

| | | | | |
|---|---|---|---|---|
| 5,153,689 | A * | 10/1992 | Okumura et al. ............. | 257/306 |
| 6,303,450 | B1 * | 10/2001 | Park et al. ..................... | 438/300 |
| 7,193,271 | B2 | 3/2007 | Lee et al. | |
| 7,419,880 | B2 | 9/2008 | Lee et al. | |
| 2004/0175909 | A1 * | 9/2004 | Matsumoto ................... | 438/592 |
| 2005/0173738 | A1 | 8/2005 | Kondo et al. | |
| 2006/0086987 | A1 * | 4/2006 | Chen et al. ................... | 257/369 |
| 2006/0228850 | A1 * | 10/2006 | Tsai et al. .................... | 438/219 |
| 2007/0018205 | A1 * | 1/2007 | Chidambarrao et al. ..... | 257/288 |
| 2009/0020806 | A1 * | 1/2009 | Anderson et al. ............ | 257/327 |

FOREIGN PATENT DOCUMENTS

| | | |
|---|---|---|
| JP | 04-245480 | 9/1992 |
| JP | 06-077479 | 3/1994 |
| JP | 08-153859 | 6/1996 |
| JP | 09-082952 | 3/1997 |
| JP | 11-186512 | 7/1999 |
| JP | 2000-260952 A | 9/2000 |
| JP | 2001-036038 | 2/2001 |
| JP | 2001-068673 | 3/2001 |
| JP | 2005-057303 | 3/2005 |
| JP | 2005-109479 | 4/2005 |
| JP | 2005-223109 | 8/2005 |
| JP | 2005-251776 A | 9/2005 |
| JP | 2006-222329 | 8/2006 |

OTHER PUBLICATIONS

Japanese Patent Office issued a Japanese Office Action dated May 26, 2009, Application No. 2007-021777.
Japanese Patent Office issued a Japanese Office Action dated Jun. 22, 2010, Application No. 2007-021777.
Japanese Official Action—2007-021777—Sep. 21, 2010.

* cited by examiner

*Primary Examiner* — Matthew Landau
*Assistant Examiner* — Daniel Luke
(74) *Attorney, Agent, or Firm* — Young & Thompson (57) ABSTRACT

This semiconductor device has an MOS transistor equipped with a gate electrode formed on a semiconductor substrate, a source region next to one side of the gate electrode, and a drain region next to another side of the gate electrode, wherein an upper end of the source region and an upper end of the drain region are at positions which are higher than a top surface of the semiconductor substrate, and the height of the upper end of the drain region differs from the height of the upper end of the source region.

14 Claims, 8 Drawing Sheets

METHOD OF MANUFACTURING A SEMICONDUCTOR DEVICE HAVING RAISED SOURCE AND DRAIN OF DIFFERING HEIGHTS

BACKGROUND OF THE INVENTION

Priority is claimed on Japanese Patent Application No. 2007-021777, filed Jan. 31, 2007, the contents of which are incorporated herein by reference.

FIELD OF THE INVENTION

The present invention relates to a semiconductor device, a fabrication method for a semiconductor device, and a semiconductor memory device, wherein non-symmetricalness has been applied to a structure of the source and the drain portions, in a structure having an MOS (Metal-Oxide-Semiconductor) transistor of a structure wherein a silicon layer has been grown on the source and the drain regions to be formed on a silicon semiconductor substrate by using silicon selective epitaxial growth technology.

DESCRIPTION OF THE RELATED ART

In recent years, in the main components of computers and electric instruments, large-scale integrated circuits (below, referred to as LSI), where many MOS transistors and/or resistors are intergraded on one chip have been adopted. In LSI, for example, in elements such as the DRAM (Dynamic Random Access Memory), rapid micronization advances, and with this, the so-called short channel effect of the MOS transistor becomes remarkable.

Therefore, as one of the methods for controlling the short channel effect, a technology is employed in which: an epitaxial silicon layer is formed on a source region and a drain region on the MOS transistor by selective epitaxial growth; and utilizing the epitaxial silicon layer as a region of the source and the drain (cf. Japanese Unexamined Patent Application, First Publication No. 2005-251776). In addition, in this technology, it is also known that the greater the thickness of the epitaxial silicon layer is, the easier it is to control the short channel effect.

In addition, a structure is known in which, in the region on a semiconductor substrate sectioned by an element separation dielectric film, two MOS transistors are arranged; an elevated source/drain structure is applied to each MOS transistor; an epitaxial layer is established on each of the source and drain regions; and the surface position of the epitaxial layer that functions as these source/drain regions are at positions that are higher than the channel of each MOS transistor (refer to Japanese Unexamined Patent Application, First Publication No. 2000-260952).

However, diffusion laminar structure of the source and drain regions formed on the semiconductor substrate were the same in all of the conventional transistor strictures of this type. That is to say, because impurity profiles of the source and drain regions are the same, the electric field strengths of the source and the drain regions are of the same structure.

In addition, in order to employ an asymmetric structure in a transistor having this kind of conventional structure, there is a method in which: a photolithography process is added; resist patterns is formed for opening only the drain region for example; and impurities are introduced only into the drain region by an ion implantation.

However, in this case, there are problems in which: the number of processes will increase and thereby increasing the cost; and, when the width of the drain is small, the opening of different height resist patterns become necessary, and thereby causing unstable yield.

Incidentally, the elements such as the above-mentioned DRAM has a three-dimensional structure in which a capacitor structure is arranged on the MOS transistor, and word wirings and bit wirings are formed between the MOS transistor and the capacitor structure in the length and width. Therefore, the equal electric fields from the source and the drain regions will be applied to both of the contact portion between the MOS transistor and the contact portion and the contact portion between the MOS transistor and the capacitor structure. Here, under the present situations where micronization of the element such as the DRAM advances, any of the MOS transistor, various wirings such as the bit wiring, and the capacitor structure are in a situation where they are micronized, and each component is distributed adjacently. Therefore, the capacity remaining in various wirings while performing a refreshing operation which is essential for the DRAM operations is increased. This causes a problem of a signal delay in the refreshing performance.

Therefore, a superior structure having a refreshing performance is desired in the DRAM where the internal structure is made minute.

The present invention was made in view of the above circumstances, and has an object of providing a semiconductor device and a fabrication method thereof, which can suppress a generation of a hot-carrier and thereby improving the hot-carrier tolerance by applying non-symmetricalness into the structure of the source region and the drain region in a MOS transistor structure where the silicon layer is formed on the source region and the drain region using silicon selective epitaxial growth technology.

In addition, the present invention also has an object of providing a semiconductor memory device having superior refreshing performance without adding a complicated process.

SUMMARY OF THE INVENTION

The present invention adopted the following means to solve the aforementioned problem.

(1) A semiconductor device including an MOS transistor provided with: a gate electrode formed on a semiconductor substrate; a source region next to one side of the gate electrode; and a drain region next to another side of the gate electrode, wherein: an upper end of the source region and an upper end of the drain region are at positions where are higher than a top surface of the semiconductor substrate; and the height of the upper end of the source region differs from the height of the upper end of the drain region.

(2) In the semiconductor device according to the above (1), it may be arranged such that, due to the difference in height from the top surface of the semiconductor substrate of the upper end of the drain region and the height from the top surface of the semiconductor substrate of the upper end of the source region, at an end of the gate electrode in the semiconductor substrate, an electric field strength in the vicinity of the source region and an electric field strength in the vicinity of the gate region differ from each other.

(3) In the semiconductor device according to the above (1), it may be arranged such that the width of the drain region and the width of the source region along a source-drain direction across the gate electrode differ from each other.

(4) In the semiconductor device according to the above (1), it may be arranged such that, the height from the top surface of the semiconductor substrate of the tipper end of the drain region is higher than the height from the top surface of the semiconductor substrate of the upper end of the source region.

(5) In the semiconductor device according to the above (1), it may be arranged such that, the width of the source region along a source-drain direction across the gate electrode is wider than the width of the drain region.

(6) In the semiconductor device according to the above (1), it may be arranged such that, a semiconductor substrate surface area in the source region is larger than a semiconductor substrate surface area in the drain region.

(7) The semiconductor device according to the above (1) may be further provided with a dummy gate electrode, where no voltage is applied, is adjacent to either one of the source region or the drain region.

(8) A semiconductor device provided with: a gate electrode formed on a semiconductor substrate; a source region next to one side of the gate electrode; a drain region next to another side of the gate electrode; a bit wiring connected to the source region; and a capacitor connected to the drain region, wherein: an upper end of the source region and an upper end of the drain region are at positions where are higher than a top surface of the semiconductor substrate; and the height of the upper end of the source region differs from the height of the tipper end of the drain region.

(9) In the semiconductor device according to the above (8), it may be arranged such that the height from the top surface of the semiconductor substrate of the upper end of the drain region is higher than the height from the top surface of the semiconductor substrate of the upper end of the source region.

(10) In the semiconductor device according to the above (8), it may be arranged such that the width of the source region along a source-drain direction across the gate electrode is wider than the width of the drain region.

(11) In the semiconductor device according to the above (8), it may be arranged such that: the gate electrode or a dummy gate electrode to which no voltage is applied is arranged on both sides of the source region and both sides of the drain region; and the distance between the gate electrodes or between the dummy gate electrodes arranged on the both sides of the source region is smaller than the distance between the gate electrodes or between the dummy gate electrodes arranged on the both sides of the drain region.

(12) In the semiconductor device according to the above (8), it may be arranged such that a semiconductor substrate surface area of the source region is larger than a semiconductor substrate surface area of the drain region.

(13) In the semiconductor device according to the above (8), it may be arranged such that the gate electrode constitutes a word wiring.

(14) A fabrication method for a semiconductor device, including the steps of: forming a gate electrode on a semiconductor substrate; and forming a silicon layer on a top surface of the semiconductor substrate in a source region next to one side of the gate electrode, and on a top surface of the semiconductor substrate in the drain region next to another side of the gate electrode, wherein while forming the silicon layer, the silicon layer is formed by a selective epitaxial growth method so that the height of an upper end portion of the silicon layer as the drain region is higher than the height of an upper end portion of the silicon layer as the source region.

(15) In the fabrication method for a semiconductor device, according to the above (14), it may be arranged such that while forming the silicon layer, a selective epitaxial growth method is used to grow the silicon layer whose thickness is controlled by controlling the size of a surface area of the semiconductor substrate where the silicon layer is grown.

(16) In the fabrication method for a semiconductor device, according to the above (15), it may be arranged such that the size of the surface area for the silicon layer growth is controlled by changing the widths of the source region and the drain region in the source-drain direction across the gate electrode.

(17) In the fabrication method for a semiconductor device, according to the above (14), it may be arranged such that the source region and the drain region are formed such that the source region becomes wider than the drain region in the source-drain direction across the gate electrode.

(18) In the fabrication method for a semiconductor device, according to the above (14), it may be arranged such that: the gate electrode include multiple and parallel gate electrodes; and the widths of the source region and the drain region are controlled by changing a gap between the gate electrodes sandwiching the source region and a gap between the source electrode sandwiching the drain region.

(19) In the fabrication method for a semiconductor device, according to the above (14), it may be arranged such that the gap between the gate electrodes sandwiching the source region is set so as to be wider than the gap between the gate electrodes sandwiching the drain region.

As explained above, according to the present invention, the non-symmetricalness is applied to the structure of the source region and the drain region, and the heights of the source region and the drain region from a channel region differs; therefore, the electric field strength in the vicinity of the source side and the vicinity of the drain side can be changed on the end side of the gate. Thereby, the field strength of the drain region side can be relaxed; and it is possible to provide a semiconductor device which can suppress a generation of a hot-carrier and thereby improving the hot-carrier tolerance.

In addition, in a semiconductor memory device which employees a structure in which the non-symmetricalness is applied to the structure of the source region and the drain region, and in which the heights of the source region and the drain region from a channel region differs, the electric field strength in the vicinity of the source side and the vicinity of the drain side can be changed on the end side of the gate. Therefore, the electric field strength of the electrode on the side connected to the bit wiring and the electric field strength of the electrode on the side connected to the capacitor can be different. As a result, for example, by reducing the electric field strength applied on the bit wiring, the problem of the signal delay of the wiring can be resolved; therefore, it is possible to realize a superior semiconductor memory device with refreshing performance without adding a special photo-lithography process.

DETAILED DESCRIPTION OF THE INVENTION

Hereinbelow, a semiconductor device according to one embodiment of the present invention will be explained with reference to the drawings; however, the present invention is not limited only to the following embodiments.

Figure 1:
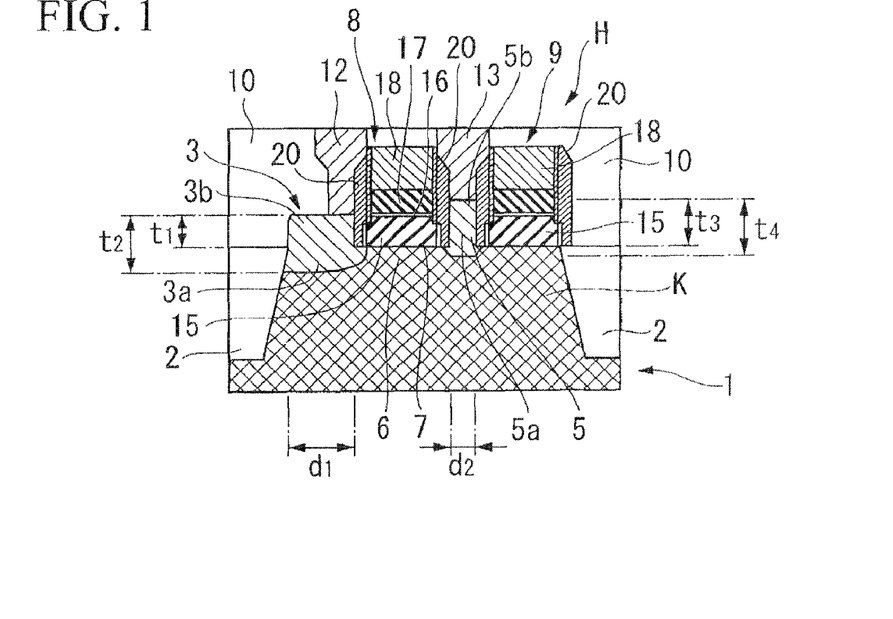
FIG. 1 is a schematic diagram showing the cross-sectional structure of a semiconductor device according to a first embodiment of the present invention.

FIG. 1 is a schematic diagram showing a cross-sectional structure of a first embodiment of a semiconductor device according to the present invention. In FIG. 1, a semiconductor substrate 1 applied to a semiconductor device H of the present invention is formed from, for example, a semiconductor such as silicon, containing impurities of a predetermined density. A trench separation dielectric film (an element separation dielectric film) 2 is formed on a surface of the semiconductor substrate 1 by an STI (Shallow Trench Isolation) method in a portion other than active regions K, and separates the adjacent active regions K.

With the semiconductor device having the above aspect: in the region where is sandwiched in-between the trench separation dielectric films 2, 2 as shown in the cross-sectional structure of FIG. 1, a drain region 5 and a source region 3 are separated and formed on the left and right; a channel region 6 is formed on a semiconductor substrate surface portion so as to be located in-between the source region 3 and the drain region 5; a gate dielectric film 7 is formed and inserted between the source region 3 and the drain region 5 on this channel region 6; and a gate electrode 8 of the deposited structure is formed on this gate dielectric film 7. In addition, in FIG. 1, on the semiconductor substrate 1 at the right side of the gate electrode 8, a dummy gate electrode 9 where no voltage is applied to become the dummy, is formed next to the trench separation dielectric film 2 that is located on the right side.

On the semiconductor substrate 1, a dielectric film 10 is formed to cover the source region 3, the drain region 5, and the gate electrode 8 and the dummy gate electrode 9, and furthermore a source electrode 12 that connects to the source region 3 and a drain electrode 13 that connects to the drain region 5 are formed in a contact hole formed on the dielectric film 10, thus configuring a semiconductor device H.

The source region 3 allows the bottom 3a to reach the active region K of the semiconductor substrate 1, and that top 3b is formed to extend out in an upward direction of the semiconductor substrate 1 at a predetermined thickness. In the thickness of this source region 3, the thickness (height) from the position of the top surface of semiconductor substrate 1 to the top surface of the source region 3 is denoted as $t_1$, while the thickness (height: total thickness) from the bottom of the source region 3 reaching the active region K to the most upper end of the source region 3, which is projecting in an upward direction on the semiconductor substrate, is denoted as $t_2$. In addition, the width of the source region 3 in the cross-sectional structure in FIG. 1 is denoted as $d_1$.

The drain region 5 is formed such that: the bottom 5a arrives at active region K of the semiconductor substrate 1; and the top of 5b extends out in an upward direction of the semiconductor substrate 1 at a predetermined thickness. In the thickness of this drain region 5, the thickness (height) from the position of the top surface of semiconductor substrate 1 to the top surface of the drain region 5 is denoted as $t_3$, while the thickness (height: total thickness) from the bottom of the drain region 5 reaching the active region K to the most upper end of the drain region 5 that is projecting in an upward direction on the semiconductor substrate is denoted as $t_4$. In addition, the width of the drain region 5 in the cross-sectional structure shown in FIG. 1 is denoted as $d_2$.

The gate electrode 8 of the present embodiment has a laminated structure including an extending layer 15 consisting of a poly-silicon layer on the gate dielectric film 7 located on the top surface of semiconductor substrate 1, a silicide layer 16 consisting of tungsten silicide laminated on top of that, a metal layer 17 consisting of a tungsten layer laminated on top of that, a hard dielectric film 18 laminated on top of that, and side walls 20, 20 consisting of a silicon nitriding film to cover the growth layer 15, the silicide layer 16, the metal layer 17, and both sides of the hard dielectric film 18. In addition, like the gate electrode 8, the dummy gate electrode 9 where no voltage is applied, has a laminated structure including side walls 20, 20 consisting of a silicon nitriding film to cover the growth layer 15, the silicide layer 16, the metal layer 17, and both sides of the hard dielectric film 18.

In the structure of the semiconductor device H, in the region where the right and left are sectioned from the element separation dielectric films 2, 2 as shown in FIG. 1, the width $d_2$ of the drain region 5 is formed so as to be narrower than the width $d_1$ of the source region 3; in other words, the width $d_1$ of the source region 3 is formed so as to be wider than the width $d_2$ of the drain region 5. Furthermore, the height $t_1$ of the source region 3 formed to protrude out higher than the top surface of semiconductor substrate 1 is formed so as to be lower than the height $t_3$ of the drain region 5 formed to protrude out higher than the top surface of semiconductor substrate 1; in other words, the height $t_3$ of the drain region 5 is formed so as to be higher than the height $t_1$ of the source region 3.

In addition, when explaining the source region 3 formed on the semiconductor substrate 1, and the drain region 5 and the positioned interval of gate electrodes 8 and 9, since the width $d_2$ of the drain region 5 is narrower than the width $d_1$ of the source region 3, the distance between the element separation dielectric film 2 on the left side of FIG. 1 and the gate electrode 8 is formed so as to be longer than the distance between gate electrodes 8 and 9.

In addition, the total layer thickness $t_2$ of the source region 3 and the total layer thickness $t_4$ of the drain region 5 are approximately the same.

Incidentally, in reference to the configuration of the semiconductor device H1 of FIG. 1, in recent MOS structures that are miniaturized, as one example, the width $d_1$ of the source region 3 located to the sides of the side wall 20 of the gate electrode 8 is formed to be substantially 150 nm, the thickness $t_1$ of the source region 3 is formed to be substantially 50 nm, the width $d_2$ of drain region 5 is formed to be substantially 50 nm, and the $t_3$ is formed to be substantially 60 nm.

Figure 2:
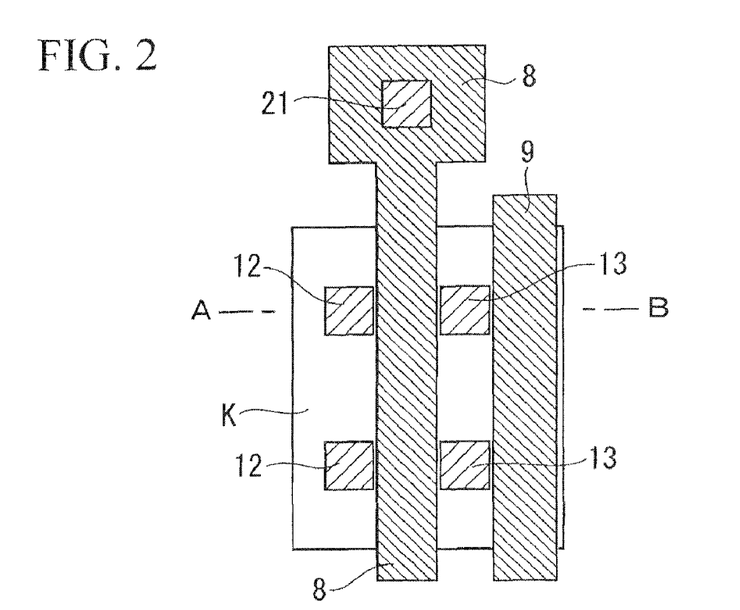
FIG. 2 is a schematic diagram showing the planar structure of the semiconductor device.

Next, the planar layout shape of the semiconductor device H of the cross-sectional structure can employ a layout structure in which: in the active region K shown in for example FIG. 2, two sets of binary structures where the source electrode 12 and the drain electrode 13 have been arranged to become a pair on the left and right side, are formed on one active region K; the gate electrode 8 is formed to extend across the active region K so as to run along between the source electrode 12 and the drain electrode 13 that have become paired on the left and right in a planar view; and the dummy gate electrode 9 is arranged beside the drain electrode 13 that is roughly separated parallel to the gate electrode 8.

In the layout structure shown in FIG. 2, other special wiring is not connected to the dummy gate electrode 9, while the contact electrode 21 for the gate supply is formed to the gate electrode 8 in an element isolation region outside the active region K, and is configured so as to be able to feed the gate electrode 8.

Next, an example of the process for producing the semiconductor device H1 of the structure shown in FIG. 1 and FIG. 2 will be explained based on FIG. 3 to FIG. 7.

Figure 3:
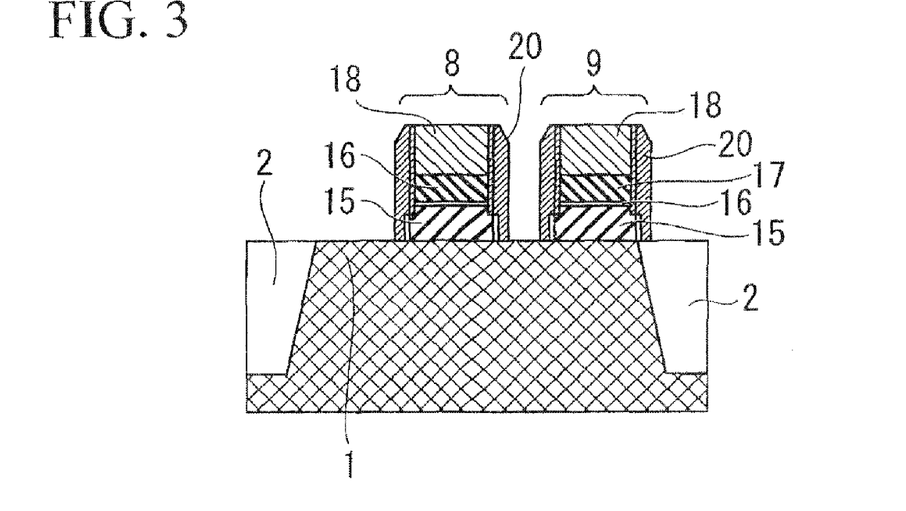
FIG. 3 is a cross-sectional schematic diagram explaining a fabrication method of the semiconductor device and shows a gate electrode formed on a semiconductor substrate.

FIG. 3 is a diagram showing a cross-sectional structure after the sidewall structure of the gate electrode has been formed by a normal MOS transistor fabrication process.

In FIG. 3, the structure of the gate electrode is shown by reference numeral 8, while the structure of the dummy gate electrode being the dummy is shown by reference numeral 9.

Figure 4:
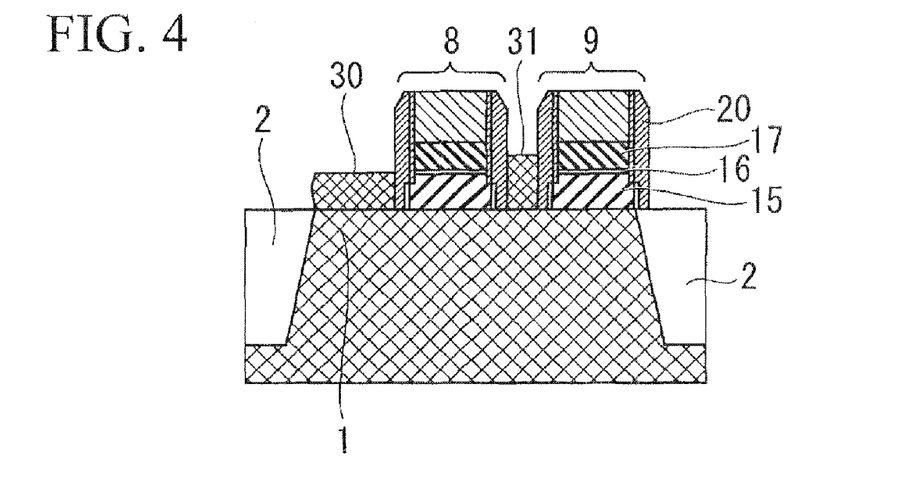
FIG. 4 is a cross-sectional schematic diagram explaining the fabrication method of the semiconductor device and shows a silicon layer that has been grown next to the gate electrode on a semiconductor substrate by selective epitaxial method.

FIG. 4 shows the state after the selective epitaxial growth of the silicon. The silicon layer formed by selective epitaxial growth on the source region side is shown by reference numeral 30, while the silicon layer formed by selective epitaxial growth on the drain region side is shown by reference numeral 31. In addition, for example, the width of the silicon substrate surface shown on the source region side is 150 nm, while the width of the silicon substrate surface shown in the drain region side is 70 nm for example.

Next, it is clear from the test result of the later embodiment that the growth rate of the silicon at the time of the selective epitaxial growth has a space-dependence between the gates. Under the deposition condition in which: the flow rate ratio of dichlorosilane which constitutes the film growth atmosphere at the time of deposition and HCl is 200 to 100 sccm; the deposition temperature is 800 degrees; and the vacuum degree in the deposition is 15 mTorr (2 Pa), it is possible to generate a silicon growth rate difference of about 20% between a portion where a space between the gate electrode is with 70 nm, and a portion where a space between the gate electrode is with 150 nm.

Thereby, it is possible to easily construct a transistor structure shown in FIG. 4 having a thickness construction in which a silicon layer thickness grown by selective epitaxial method is 50 nm in the source region, while the thickness in the drain region is 60 nm.

Figure 5:
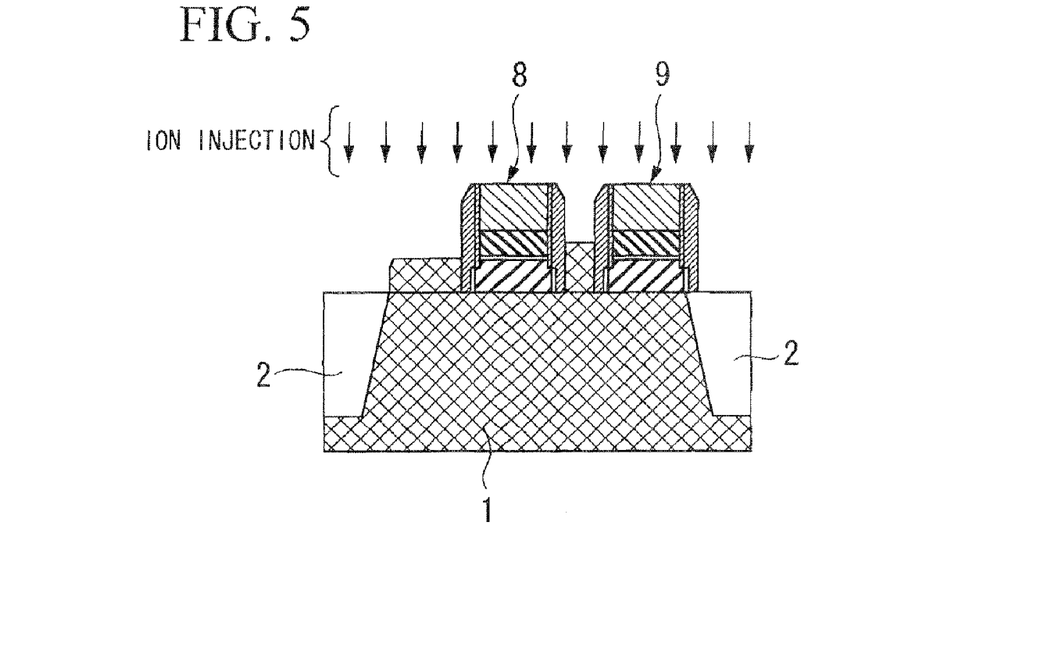
FIG. 5 is a cross-sectional schematic diagram explaining the fabrication method of the semiconductor device and shows impurity doping.
Figure 6:
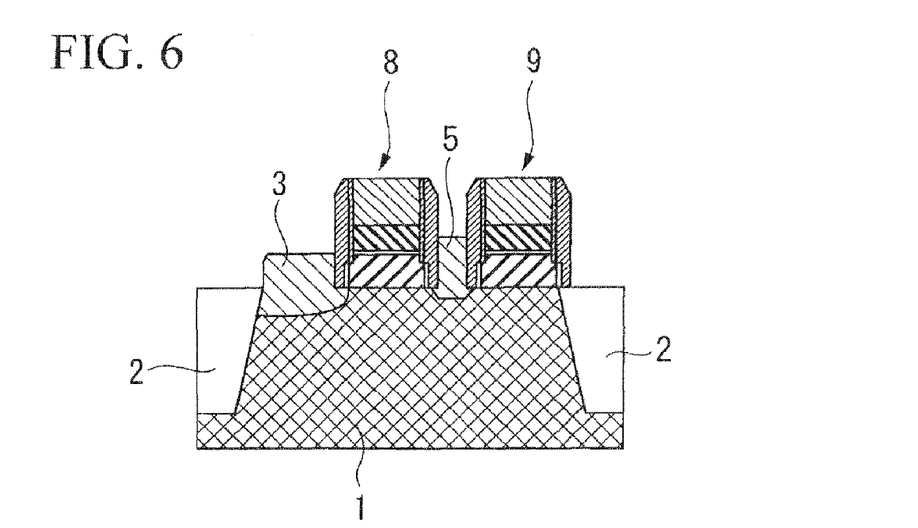
FIG. 6 is a cross-sectional schematic diagram explaining the fabrication method of the semiconductor device and shows formed source and drain regions.

Thereafter, as shown in FIG. 5, As (arsenic) is injected at a dose of $4\times10^{15}$ cm$^{-2}$ over the entire surface at 30 keV. Next, the source region 3 is formed on the source region side shown in FIG. 6 by activating the As by heat-treating at 950° C. for 10 seconds; the drain region 5 is formed on the drain region side; and the MOS transistor structures where the depths in the silicon substrate of the impurities layers differ with each other can be formed.

Figure 7:
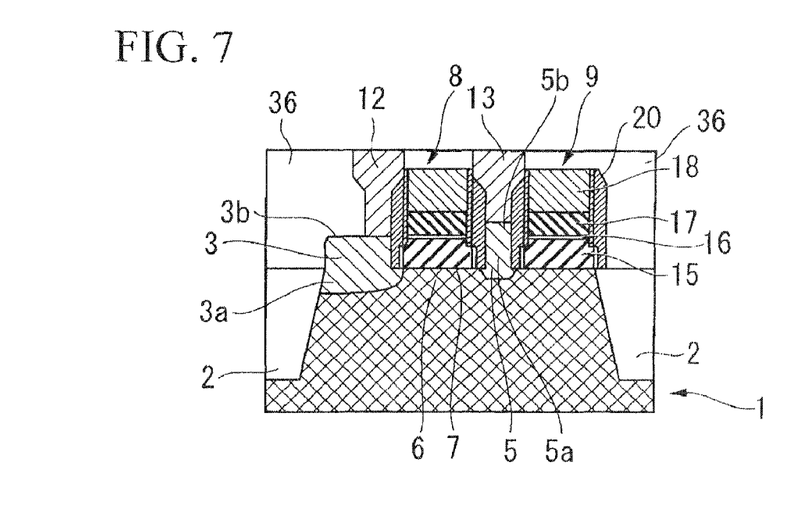
FIG. 7 is a cross-sectional schematic diagram explaining the fabrication method of the semiconductor device and shows formation of electrode layers for external contact and in-between dielectric layers.

Next, if the dielectric film 36 is formed between layers, as shown in FIG. 7, and a contact hole is opened by normal photolithography technology and dry etching technology; and if a conductive film is accumulated in the hole and the conductive film on the dielectric film between layers is removed by CMP method, then the structure shown in FIG. 7 can be obtained, and this structure becomes equal with the structure shown in FIG. 1.

If the semiconductor device H1 is of the structure shown in FIG. 1 or FIG. 7 that was provided by the fabrication method explained above, then the height $t_3$ of the drain region 5 that is higher than the channel region can be raised higher than the height $t_1$ of source region 3, the relaxation of the electric field of the drain region 5 side can be acquired, and the MOS transistor which is superior in hot-carrier tolerance can be provided.

Figure 8:
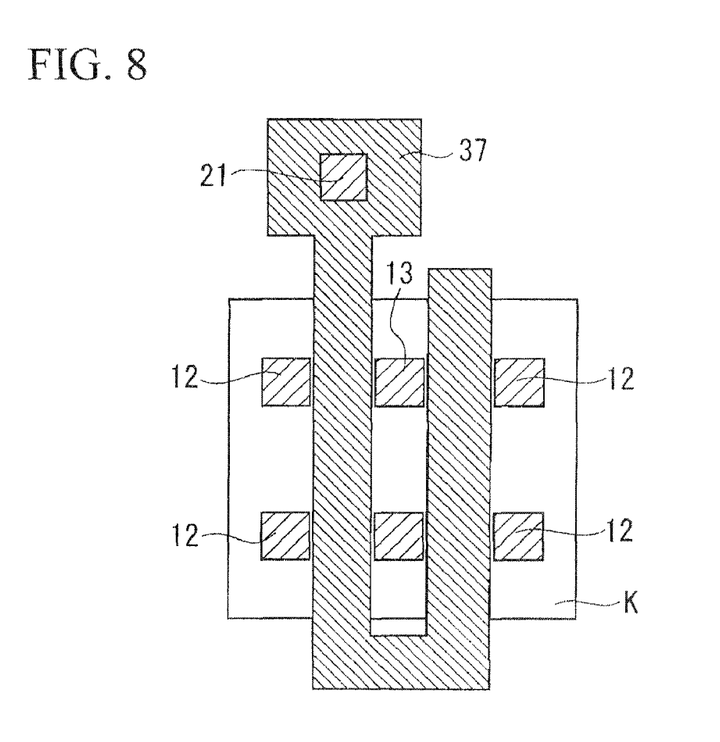
FIG. 8 is a top view showing an example where the shape of the gate electrode has been changed in the semiconductor device.
Figure 9:
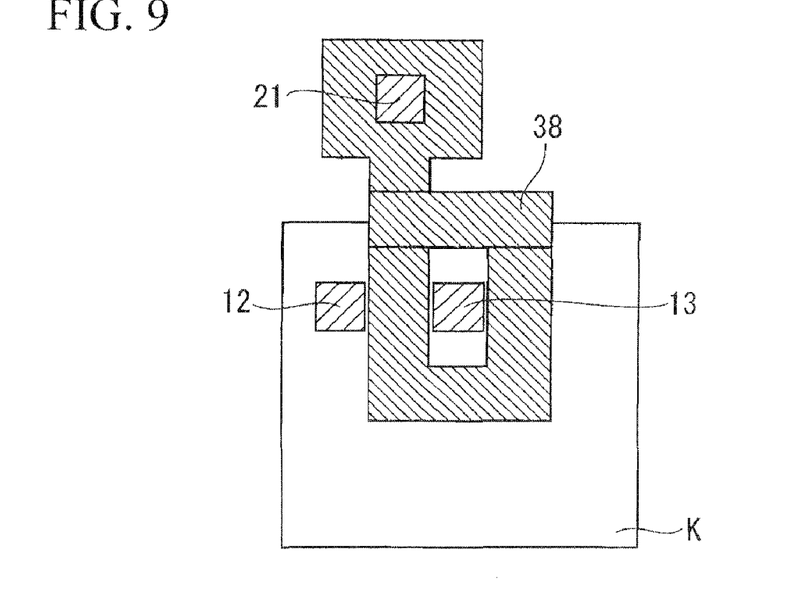
FIG. 9 is a top view showing another example where the shape of the gate electrode has been changed in the semiconductor device.

Incidentally, the planar layout structure of the transistor used for the present invention is not limited only to the case having a dummy gate electrode 9 shown in FIG. 2. And even when the gate electrode 37 is bent so as to be the L-shape in a planar view as shown in FIG. 8, to surround the drain region 5, the similar effect can be obtained. In addition, as shown in FIG. 9, even when the structure where the gate electrode 38 is arranged so as to surround the region of the drain region 5, the similar effect can be obtained.

Next, an example of applying the semiconductor device structure according to the present invention to a semiconductor memory device (DRAM) will be explained with reference to FIG. 10 to FIG. 15.

Figure 13:
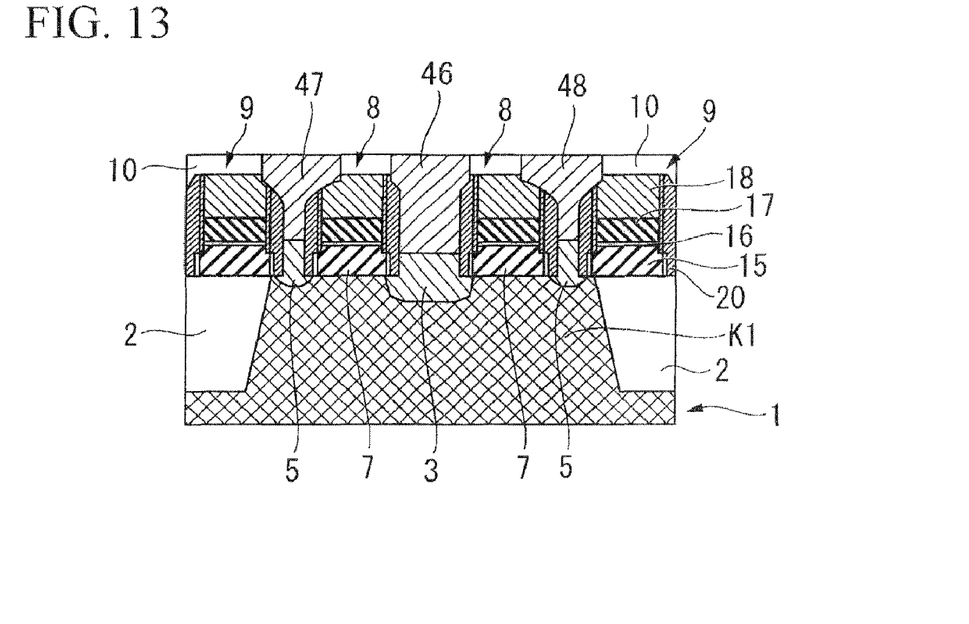
FIG. 13 is a cross-sectional schematic diagram showing an example of the semiconductor memory device according to the present invention.
Figure 14:
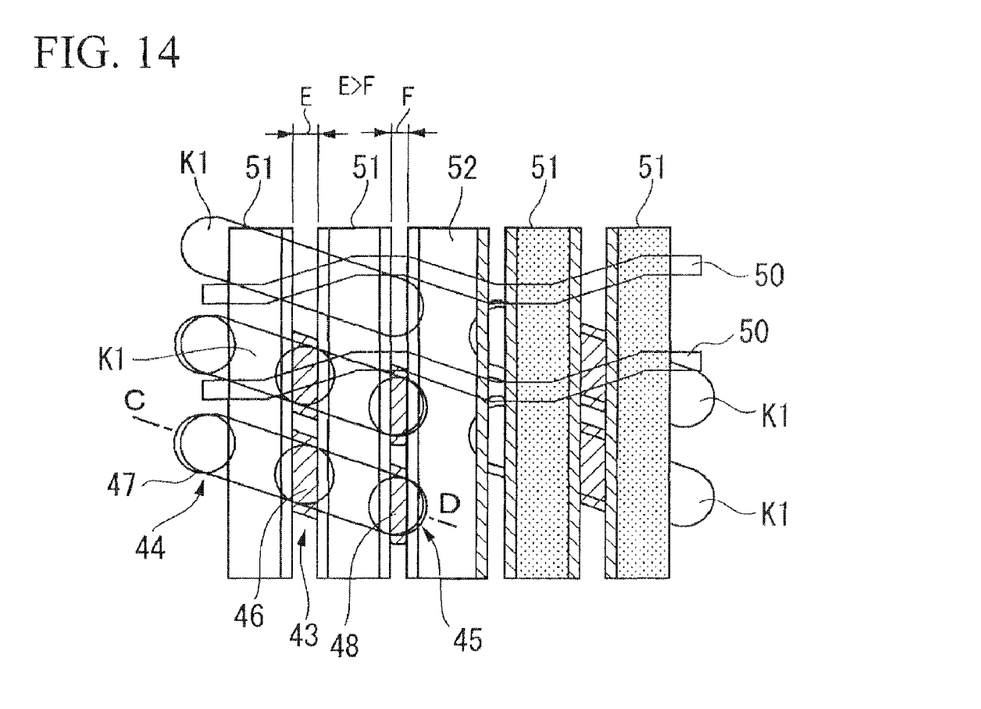
FIG. 14 is a schematic diagram showing the planar structure of an example of the semiconductor memory device.
Figure 15:
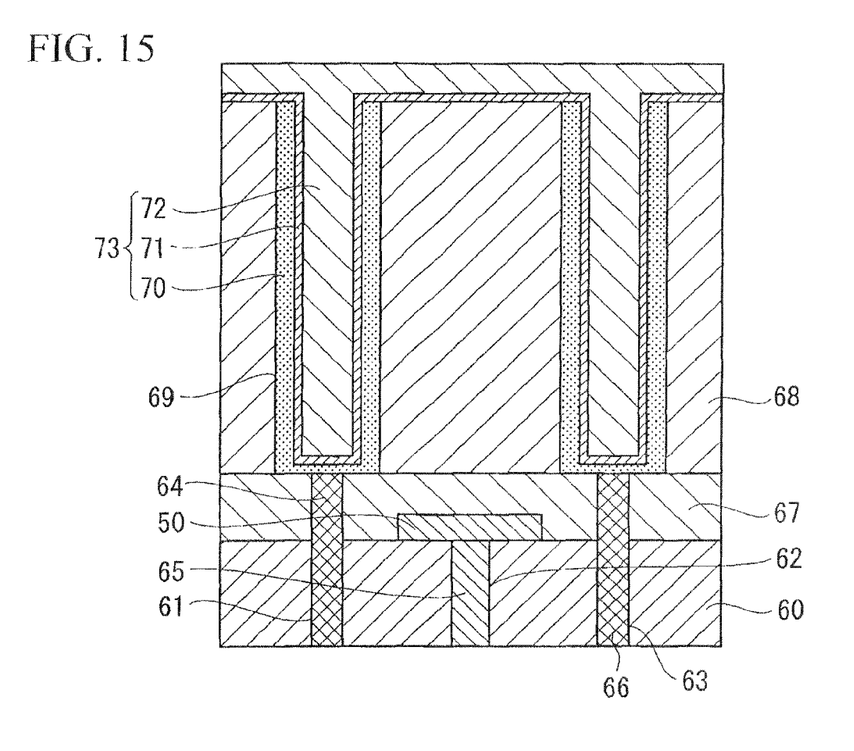
FIG. 15 is a cross-sectional schematic diagram of the capacitor structure portion of an example of the semiconductor memory device.

FIG. 10 to FIG. 13 are diagrams to explain the fabrication process of the semiconductor memory device according to the present invention step by step, and the semiconductor memory device of the structure shown in FIG. 13 to FIG. 15 is provided. In addition, FIG. 15 is an example of the capacitor structure arranged three-dimensionally in the upper portion of the semiconductor device and the bit wiring and the word wiring shown in FIG. 13 and FIG. 14 in a deposited form.

With this embodiment, an example structure for when the present invention is applied to the cell structure having a memory cell of 2 bits is arranged in one active region K is shown.

With the structure of this embodiment, as shown in the planar structure in FIG. 14, the plurality of elongated strip active regions K1 are formed so as to be arranged at predetermined intervals individually; the impurities diffusion layers are individually arranged in both ends and the central part of each active region K1. Furthermore, in this form, the drain region 43 is formed in the central region; the source regions 44 and 45 are formed in both ends side; and the contact region (source electrode) 46, the contact region (drain electrode) 47, and the contact region (drain electrode) 48 are specified so as to be just above them in an arranged form.

In addition, the active region K1 of the planar shape such as shown in the above-mentioned diagram in the present embodiment has a specific shape, but since the shape and the direction of the active region K1 should not be especially limited, the shape of the active region K1 shown in FIG. 14 may of course employ other active region shapes which is applicable to transistors of general semiconductor memory devices, and is not limited to the shape of the present embodiment.

Next, bit wirings 50 are extended in the widthwise (X) direction of FIG. 14 in the shape of a polygonal line. In addition, linear word wirings 51 and dummy word wirings 52 extending along the lengthwise (Y) direction of FIG. 14 are arranged at predetermined intervals along the widthwise (X) direction of FIG. 1. The word lines 51 are configured so as to include the gate electrode 8 or the dummy gate electrode 9 at portions intersecting with the active region K1.

Also in the transistor structure of the semiconductor memory device of the present embodiment, like the semiconductor device H1 that was explained in the above with reference to FIG. 1, the gate electrode 8 or the gate electrode 9 is arranged in an activate region K1 sectioned between the element separation dielectric films 2, 2. In the present embodiment, the dummy gate electrode 9 on the element separation dielectric film 2 on the left, the gate electrodes 8, 8 having a stricture capable of feeding, and the dummy gate electrode 9 on element separation dielectric film 2 on the right side, are arranged in order from the left of FIG. 1. In the DRAM structure, since the element separation dielectric film 2 and the activated region K1 are arranged in plural numbers repeatedly, and thereby forming the planar structure shown in FIG. 14.

Since the structure of the gate electrodes 8, 9 and the structure of the semiconductor substrate 1 are basically equivalent to the structure of semiconductor device H1 that was shown in FIG. 1, explanation therefor will be omitted here.

In the present embodiment, one source region 3 is established in the central part of activated region K1, and drain regions 5, 5 are separately arranged on both the left and right sides. Therefore, the channel region and the drain regions 5, 5 are formed on both the left and right sides of source region 3.

The relationship of the thickness of these source regions 3 and the relationship of the thickness of the drain region 5 are basically equivalent to the structure shown in FIG. 1.

In addition, in the contact regions 46, 47, and 48 shown in FIG. 15, a capacitor structure showing a cross-sectional structure in FIG. 15 is formed as an example. In the structure according to the present example: a second in-between dielectric film 60 is formed on a dielectric film 10 shown in FIG. 13; contact holes 61, 62, and 63 are formed individually at the corresponding positions on contact portions 46, 47, and 48 in the second in-between dielectric film 60; contact plugs 64, 65, and 66 are formed in these contact holes; and a bit wiring 50 is arranged on the contact plug 65. Furthermore, a third in-between dielectric film 67 is formed on the second in-between dielectric film 60; a fourth in-between dielectric film 68 is formed on the third in-between dielectric film 67; a capacity memory portion 73 including a lower electrode 70, a capacity dielectric film 71, and an upper electrode 72 are formed so as to be filled in a cylinder hole 69 formed in the fourth in-between dielectric film 68; and each of the capacity memory portions 73 is connected to a contact region (source electrode) 46 or a contact region (drain electrode) 48, shown in FIG. 13, and the DRAM structure is thereby configured.

In the DRAM structure configured as above, the height of the top of the drain region 5 from the channel region being a reference, is formed so as to be higher than the height from the channel region to the top of source region 3 that is located in the upper portion than the channel region.

Other structures are basically similar to the structure of previously mentioned semiconductor device H1 in FIG. 1.

In the DRAM planar layout structure diagram shown in FIG. 14, the space E which is the space between the gates that forms a contact portion 46 for the bit wiring is a wider layout than the space F between the gates that form a contact portion 47 and 48 for capacitors. In this case, for example, the space E can be 70 nm and the space F can be 50 nm.

Figure 10:
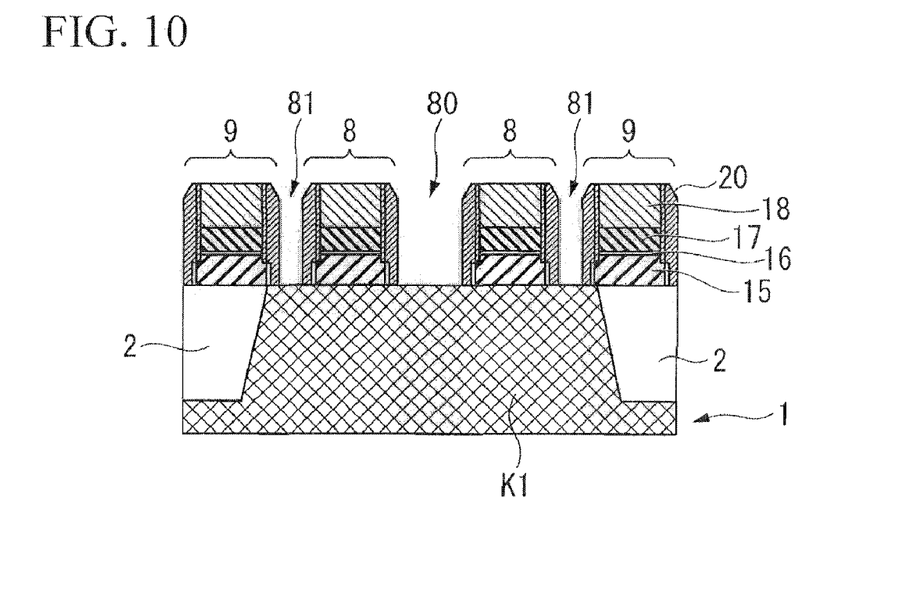
FIG. 10 is a cross-sectional schematic diagram explaining the fabrication method of the semiconductor memory device and shows as a gate electrode is formed on a semiconductor substrate.

To obtain the structure shown in FIG. 13, after having formed the side wall structure of the pass gate of the memory cell as shown in FIG. 10 using a normal DRAM fabrication process, the following process is performed.

As clear from test results mentioned later, the growth rate of the selective epitaxial growth silicon depends on the space between the gates, and when the conditions of the flow rate ratio is 200 to 100 sccm for the dichlorosilane and HCL, the deposition temperature is 800 degrees, and the vacuum degree at the time of deposition is 15 mTorr, the growth rate difference of 5% occurs between the 50 nm portion and the 70 nm portion in the space between the gates.

Thereby, it is possible to fabricate a transistor configuration in which: the thickness of the silicon film 80*a* formed by selective epitaxial method is 60 nm at the space portion 80 between the gates that forms a contact for the bit wiring; and the silicon films 81*a* and 82*a* are 63 nm at spaces 81 and 82 between the gates that form the contact for capacitors.

Figure 11:
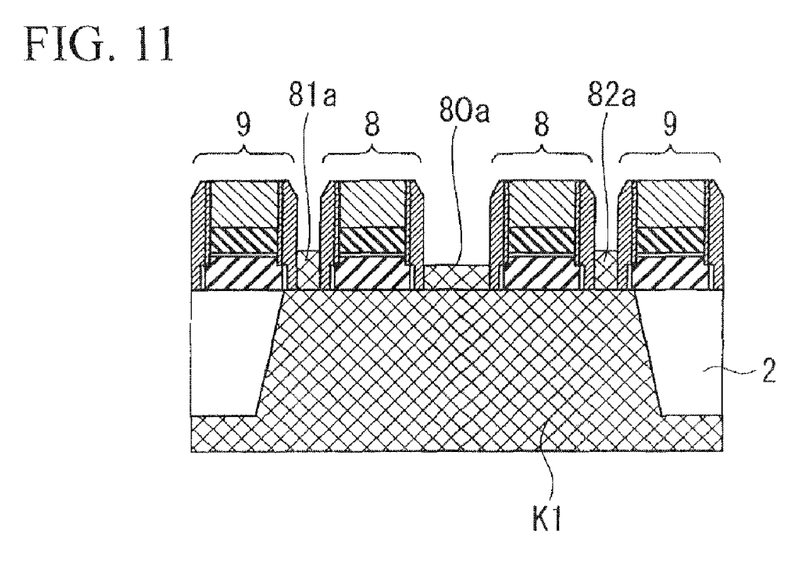
FIG. 11 is a cross-sectional schematic diagram explaining the fabrication method of the semiconductor device and shows as a silicon layer has been grown next to the gate electrode on a semiconductor substrate.
Figure 12:
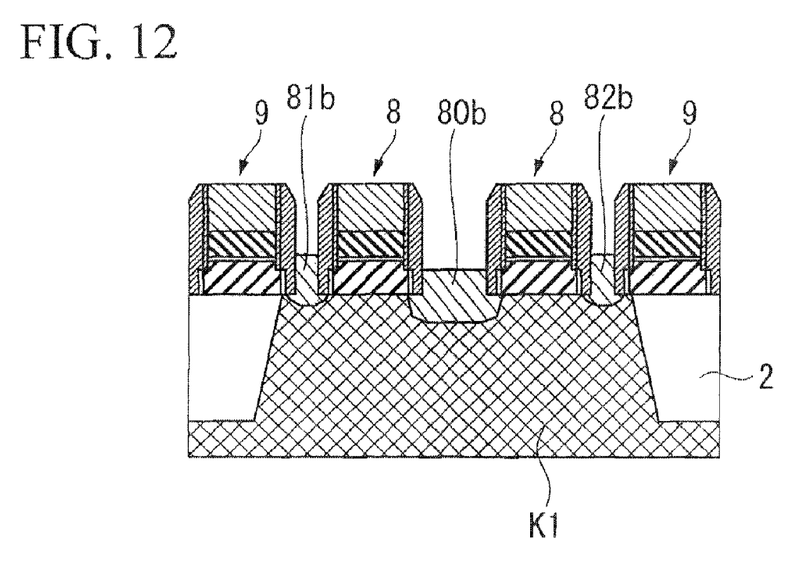
FIG. 12 is a cross-sectional schematic diagram explaining the fabrication method of the semiconductor device and shows a formation of the source and drain regions by impurity doping.

After this, P (phosphorus) is injected over the entire surface at $1 \times 10^{13}$ cm$^{-2}$ and 60 keV. Thereby, it is possible to form the MOS transistor having a source region 80*b* and drain regions 81*b* and 82*b*, where the depth in the silicon substrate of the impurities layer differ at the regions where contacts for bit wires and for capacitors shown in FIG. 11 are formed.

Next, an in-between dielectric film is formed; contact holes are opened by normal lithography technology and dry etching technology; after accumulating conductive films 46, 47, and 48 in the hole simultaneously, the conductive films are removed from the in-between dielectric film layer by the CMP method; and heat-treatment at 980° C. for 10 seconds, and thereby forming the structure shown in FIG. 13. With this structure, a DRAM can be obtained which has superior refreshing performance by relaxing an electric field of the capacitor contact side.

For example, in the above-mentioned structure, in the space between the gates of the cell contact side and the bit wiring contact side in a DRAM transfer MOS transistor, the space between the gates of the cell contact side is formed so as to be narrower than the bit line contact side.

As a result, since the selective epitaxial growth rate of the cell contact side can be grown faster than the speed of the selective epitaxial growth of the bit line contact side, the film thickness of the silicon by the selective epitaxial of the cell contact side is formed so as to be thicker than the film thickness of the silicon of the bit line contact side.

And, by thereafter introducing the impurities for the source/drains, the impurities density distribution of the source side and the drain side can be non-symmetricalness. That is to say, the DRAM having the superior refreshing performance can be formed by relaxing the electric field of the cell contact side (drain electrodes 5, 5 side). In addition, since it is not necessary to add a lithography process for the injection in the process of forming the non-symmetricalness in the impurities density distribution, the process can be carried out easily.

EMBODIMENT

Test Examples

After the element separation dielectric film is formed on the silicon substrate by an STI method, a photolithography method is performed repeatedly, and thereby forming a gate electrode and a dummy gate electrode having the structure shown in FIG. 3.

In the structure shown in FIG. 3, in order to apply the following selective epitaxial method, each sample was formed such that: the width of the semiconductor substrate located to the sides of the side wall of the gate electrode was 150 nm; the intervals of the gate electrode and the dummy gate electrode are set to be 50 nm, (110) nm, 260 nm, 270 nm, 280 nm, and 520 nm (the range within 50 nm to 520 nm).

Figure 16:
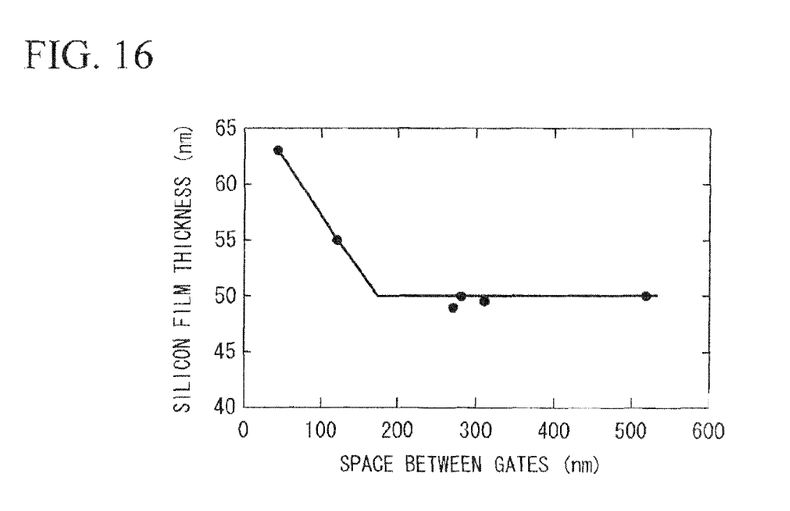
FIG. 16 is a diagram showing the relationship of: the space between the gates; and the thickness of the silicon layer (film thickness) grown by selective epitaxial method, which was obtained from experiments in the embodiments.

Here, following selective epitaxial method, when a deposition condition is made such that: the flow rate ratio between the dichlorosilane and HCl is 200 to 100 sccm; the deposition temperature is 800 degrees; and the vacuum degree in the deposition is 15 mTorr (2 Pa), it was recognized that the state where the silicon layer grows on the silicon substrate can be indicated by the correlation shown in FIG. 16.

From the correlation shown in FIG. 16, it is understood that the growth rate difference of about 20% is generated in the space between the gate electrodes with the 70 nm portion and 150 nm portion.

It became clear that when a silicon film is grown in this manner by using selective epitaxial method, the film thickness of the provided silicon film could be controlled by regulating the space between the gate electrodes.

Embodiment 1

In order to produce the structure shown in FIG. 1, a gate electrode having the sidewall structure shown in FIG. 3 was formed according to the MOS transistor fabrication process. The width of the silicon substrate surface shown on the source side was 150 nm and the width of the silicon substrate surface shown on the drain side was 70 nm.

An Si board is employed as the semiconductor substrate, and the gate electrode having a 70 nm thick poly-silicon extending layer, a 5 nm to 10 nm thick tungsten silicide layer, a 50 nm thick tungsten metal layer, a 140 nm thick silicon nitride hard dielectric film, and a 20 nm thick side wall was formed at the intervals as previously mentioned.

Next, a silicon layer was grown by the selective epitaxial method with a condition of: the flow rate ratio between the dichlorosilane and HCl of 200 to 100 sccm; the deposition temperature of 800 degrees; and the vacuum degree in the deposition of 15 mTorr (2 Pa). As the result, a growth rate difference of about 20% was generated in the space between the gate electrodes at the 70 nm portion and 150 nm portion, and a transistor structure was formed where the silicon film thickness was 50 nm at the source region and 60 nm at the drain region. Thereafter, As (arsenic) was injected over the entire surface of the semiconductor substrate at $4 \times 10^{15}$ cm$^{-2}$ and 30 keV.

Next, by activating the As by heat-treatment at 950° C. for 10 seconds, an MOS transistor was made where the depth in the silicon substrate of the impurities layer in the source and the drain regions shown in FIG. 4 differs.

Embodiment 2

In order to produce a DRAM having the layout structure shown FIG. 13 to FIG. 14, a gate electrode including the sidewall structure shown in FIG. 13 is formed following an MOS transistor fabrication process. In the planar layout structure shown in FIG. 14, space E was 70 nm, and space F was 50 nm.

An Si board is employed as the semiconductor substrate, and the gate electrode including a 70 nm thick poly-silicon extending layer, a 5 nm to 10 nm thick tungsten silicide layer, a 50 nm thick tungsten metal layer, a 140 nm thick silicon nitride hard dielectric film, and a 20 nm thick side wall, were formed at the intervals previously mentioned.

Next, a silicon layer was grown by selective epitaxial method under the condition of: the flow rate ratio between the dichlorosilane and HCl of 200 to 100 sccm; the deposition temperature of 800 degrees; and the vacuum degree in the deposition of 15 mTorr (2 Pa). As the result, at the portion where the space between the gate electrode of the bit wiring contact side is 70 nm, and at the portion where the space between the gate electrode of the capacitor contact side is 50 nm, a growth rate difference of 5% occurred, and thereby forming a structure where the thickness on the space side between the gate electrode of the bit wiring contact side was 60 nm, and on the space side between the gate electrode of the capacitor contact side the thickness was 63 nm.

Thereafter, P (phosphorus) is injected over the entire surface of the semiconductor at $1 \times 10^{13}$ cm$^{-2}$ and 60 keV.

Thereby, an MOS transistor could be made, in which the depths in the silicon substrate of the impurities layer differ at the regions where contacts for bit wires and for capacitors shown in FIG. 13 are formed. Next, the structure shown in FIG. 13 was made by: forming an in-between dielectric film of silicon nitride; opening contact holes by the lithography technology and the dry etching technology; after accumulating the conductive films in the hole simultaneously, removing the conductive films on the in-between dielectric film; and performing a heat-treatment at 980° C. for 10 seconds.

While preferred embodiments of the invention have been described and illustrated above, it should be understood that these are an exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

What is claimed is:

1. A fabrication method for a semiconductor device, comprising:
   forming a gate electrode above a semiconductor substrate;
   forming a silicon layer on a top surface of a first region in the semiconductor substrate adjacent one side of the gate electrode, and on a top surface of a second region in the semiconductor substrate adjacent another side of the gate electrode, wherein the first region is wider than the second region in the first region-second region direction across the gate electrode; and
   forming, after forming the silicon layer by a selective epitaxial growth method, a first impurities diffusion region and a second impurities diffusion region by injecting impurities over the first region and the second region through the silicon layer,
   wherein the silicon layer is formed by the selective epitaxial growth method so that the height of an upper end portion of the silicon layer at the second region is higher than the height of an upper end portion of the silicon layer at the first region, and wherein by injecting the impurities, a depth of the second impurities diffusion region from the top surface of the semiconductor substrate is formed so as to be shallower than a depth of the first impurities diffusion region from the top surface of the semiconductor substrate.

2. The fabrication method for a semiconductor device, according to claim 1, wherein while forming the silicon layer, the selective epitaxial growth method is used to grow the silicon layer whose thickness is controlled by controlling the size of a surface area of the semiconductor substrate where the silicon layer is grown.

3. The fabrication method for a semiconductor device, according to claim 2, wherein the size of the surface area for the silicon layer growth is controlled by controlling the widths of the first region and the second region in the first region-second region direction across the gate electrode.

4. The fabrication method for a semiconductor device, according to claim 1, wherein:
the gate electrode includes multiple and parallel gate electrodes; and
the widths of the first region and the second region are controlled by a gap distance between gate electrodes sandwiching the first region and a gap distance between gate electrodes sandwiching the second region.

5. The fabrication method for a semiconductor device, according to claim 4, wherein the gap distance between gate electrodes sandwiching the first region is set so as to be wider than the gap distance between gate electrodes sandwiching the second region.

6. The fabrication method for a semiconductor device, according to claim 1, further comprising:
forming a bit wiring so as to be connected to the first impurities diffusion region; and
forming a capacitor so as to be connected to the second impurities diffusion region.

7. The fabrication method for a semiconductor device, according to claim 1, further comprising forming a dummy gate electrode, where no voltage is applied, so as to be adjacent to either one of the first impurities diffusion region and the second impurities diffusion region.

8. The fabrication method for a semiconductor device, according to claim 7, further comprising forming a dielectric film so as to cover the first region, the second region, the gate electrode, and the dummy electrode.

9. The fabrication method for a semiconductor device, according to claim 1, wherein the first region is a source region while the second region is a drain region.

10. A fabrication method for a semiconductor device, comprising:
forming a semiconductor layer that includes an active region;
forming at least one gate electrode pattern that passes over the active region to divide the active region into at least first and second regions in the active region, the first region having an upper surface that is larger in area than an upper surface of the second region;
forming an isolation region in the semiconductor layer to define the active region, the upper surface of the first region having a first peripheral edge defined by the isolation region and a second peripheral edge defined by the gate electrode pattern;
forming a dummy gate electrode pattern simultaneously with the gate electrode pattern, the dummy gate electrode pattern passing over the active region, the upper surface of the second region having a third peripheral edge defined by the isolation region, a fourth peripheral edge defined by the gate electrode pattern, and a fifth peripheral edge defined by the dummy gate electrode pattern; and
performing a selective epitaxial growth on each of the upper surfaces of the first and second regions to form a first silicon layer on the first region and a second silicon layer on the second region, the first silicon layer being smaller in thickness than the second silicon layer.

11. The fabrication method for a semiconductor device, according to claim 10, wherein the forming the isolation region comprises forming a trench in the semiconductor layer to surround the active region and filling the trench with an insulating film.

12. The fabrication method for a semiconductor device, according to claim 10, wherein a distance between the gate electrode pattern and the isolation region is larger than a distance between the gate electrode pattern and the dummy gate electrode pattern.

13. The fabrication method for a semiconductor device, according to claim 10, further comprising performing an injection of impurities into the first and second regions after performing the selective epitaxial growth.

14. A method, comprising:
forming a semiconductor layer that includes an active region;
forming at least one gate electrode pattern that passes over the active region to divide the active region into at least first and second regions in the active region, the first region having an upper surface that is larger in area than an upper surface of the second region, the upper surfaces of the first and second regions being substantially coplanar with each other;
forming an isolation region in the semiconductor layer to define the active region, the upper surface of the first region having a first peripheral edge defined by the isolation region and a second peripheral edge defined by the gate electrode pattern;
forming a dummy gate electrode pattern simultaneously with the gate electrode pattern, the dummy gate electrode pattern passing over the active region, the upper surface of the second region having a third peripheral edge defined by the isolation region, a fourth peripheral edge defined by the gate electrode pattern, and a fifth peripheral edge defined by the dummy gate electrode pattern; and
performing a selective epitaxial growth on each of the upper surface of the first and second regions to form a first silicon layer on the first region and a second silicon layer on the second region, the first silicon layer being smaller in thickness than the second silicon layer.

* * * * *